(12) United States Patent
Sheik-Bahae et al.

(10) Patent No.: US 11,088,506 B1
(45) Date of Patent: Aug. 10, 2021

(54) CTE-MATCHED TEXTURED HEATLINKS FOR OPTICAL REFRIGERATION

(71) Applicant: UNM RAINFOREST INNOVATIONS, Albuquerque, NM (US)

(72) Inventors: Mansoor Sheik-Bahae, Albuquerque, NM (US); Alexander Robert Albrecht, Albuquerque, NM (US); Junwei Meng, Albuquerque, NM (US)

(\*) Notice: Subject to any disclaimer, the term of this patent is extended or adjusted under 35 U.S.C. 154(b) by 208 days.

(21) Appl. No.: 16/260,680

(22) Filed: Jan. 29, 2019

Related U.S. Application Data

(60) Provisional application No. 62/623,066, filed on Jan. 29, 2018.

(51) Int. Cl.
*H01S 5/024* (2006.01)
*B23K 26/00* (2014.01)
*G02B 6/02* (2006.01)

(52) U.S. Cl.
CPC ...... *H01S 5/02407* (2013.01); *B23K 26/0093* (2013.01); *G02B 6/0218* (2013.01)

(58) Field of Classification Search
CPC ........ H01S 3/04; H01S 3/1618; H01S 3/1653; H01S 3/042; H01S 3/048; H01S 3/13; H01S 3/1317; H01S 3/1305; H01S 3/1304; H01S 3/137; H01S 5/02407; G02B 6/0218; B23K 6/0093
See application file for complete search history.

(56) References Cited

U.S. PATENT DOCUMENTS

| | | | | |
|---|---|---|---|---|
| 5,272,710 A | \* | 12/1993 | Sumida | H01S 3/042 372/34 |
| 2010/0212656 A1 | \* | 8/2010 | Qiu | F24S 20/20 126/618 |
| 2015/0075181 A1 | \* | 3/2015 | Epstein | F25B 23/003 62/3.1 |

OTHER PUBLICATIONS

Olsen et al, Transmittance of Single-Crystal Magnesium Fluoride and IRTRAN-1\* in the 0.2- to 15-µ Range, Journal of the Optical Societyof America, vol. 53, Issue 8, p. 1003_1-1005 (1963).\*

\* cited by examiner

*Primary Examiner* — Elizabeth J Martin
(74) *Attorney, Agent, or Firm* — MH2 Technology Law Group LLP (57) ABSTRACT

An optical refrigeration system that includes a heatlink that is formed by textured crystals that are matched in coefficient of thermal expansion (CTE) to the yttrium lithium fluoride (YLF) cooling crystal, and shaped in geometries that result in very low heat producing losses (HPL). The optical refrigeration system may further include a mirror that is made of a semiconductor-material.

18 Claims, 5 Drawing Sheets

CTE-MATCHED TEXTURED HEATLINKS FOR OPTICAL REFRIGERATION

PRIORITY

This application claims priority to provisional U.S. Patent Application Ser. No. 62/623,066 filed Jan. 29, 2018, the disclosure of which is herein incorporated by reference in its entirety.

TECHNICAL FIELD

The present teachings relate generally to the field of optical refrigeration, and more particularly to providing heatlinks in the optical refrigeration device with new geometric shapes, textures, and materials that are matched in coefficient of thermal expansion (CTE) to the cooling crystals.

BACKGROUND

Optical refrigeration (OR) is a technique for cooling a rare earth ions-doped solid, such as a macroscopic crystal or glass, with a laser beam. The technique relies on anti-Stokes fluorescence to remove heat from a glass or crystalline host. The optical solid is doped with rare earth ions, such as doping a yttrium lithium fluoride (YLF) crystal as a cooling crystal, and the ions are excited by the laser beam in the cooling process. The technique involves using a laser wavelength that is longer than the average wavelength of the resulting fluorescence, such that the energy of the absorbed photons is lower than the average energy of the emitted photons, thus removing energy from the cooling crystal.

Figure 1:
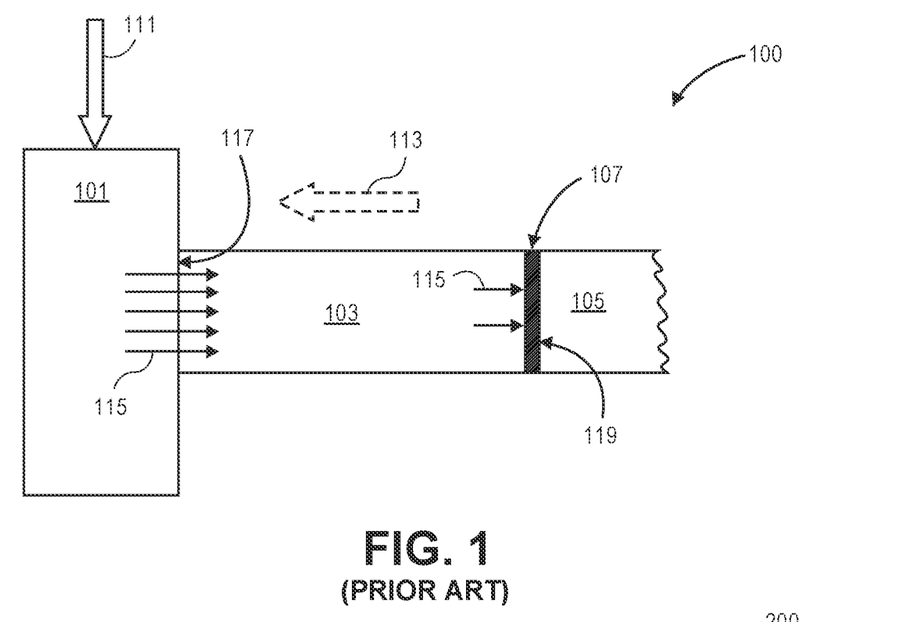
FIG. 1 is a schematic diagram of an optical refrigeration system.

FIG. 1 is a schematic diagram of an optical refrigeration system 100, including a cooling crystal 101 that is connected to one end of a heatlink 103 (also known as a thermal link), typically by an adhesive-free bonding method, and the heatlink 103 is separately connected to a payload 105, which can be a cold finger of a refrigerator. In the optical refrigeration process, the laser beam 111 is sent through the cooling crystal 101 to remove energy from the cooling crystal, and fluorescence light 115 created by the laser beam inside the cooling crystal 101 is reflected towards the heatlink 103 and the payload 105. If the payload 105 is not shielded from the intense fluorescence light 115 created, the fluorescence light 115 would be absorbed by the payload 105 and converted to heat.

The heat link 103 acts as a shield of fluorescent light for the payload such that the payload receives minimal amount of fluorescent light, and the heat link 103 also acts as a thermal conductor that transfers heat from the payload 105 towards 113 the cooling crystal 101. Ideally, a good heatlink for the optical refrigeration system has a good mechanical and thermal contact with the cooling crystal and the payload, but also isolates the payload from the fluorescence light created at the cooling crystal.

A commonly used heatlink material is sapphire. Sapphire has low optical absorption and high thermal conductivity. However, the coefficient of thermal expansion (CTE) between sapphire and the YLF cooling crystal are significantly different, which causes problems in bonding the material together at an interface 117 of the two materials. Even if the materials are bonded, the differences in CTE causes stresses on the bond when temperature changes in the optical refrigeration system and often results in mechanical failure of the bond or the cooling crystal. Another heatlink material is undoped YLF, which does not have the problem of mismatch in CTE between the cooling crystal and the heatlink, however, the thermal conductivity of the YLF material is much lower than sapphire.

Another method to reduce the conversion to heat is to place a dielectric mirror 107 at an interface 119 in between the heatlink 103 and the payload 105 to reduce the amount of light transmitted to the payload 105. However, dielectric mirror's reflectivity drops significantly with higher angles of incidence. Also, dielectric mirrors typically have very low thermal conductivity, thus significantly reduces the thermal conductivity between the heatlink 103 and the payload 105, and also reduces the thermal conductivity between the cooling crystal 101 and the payload 105. Although a metal mirror may be used, which has good thermal conductivity, reflectivity of a metal mirror is much lower than a dielectric mirror, and therefore does not prevent light absorption of the payload 105.

Figure 2:
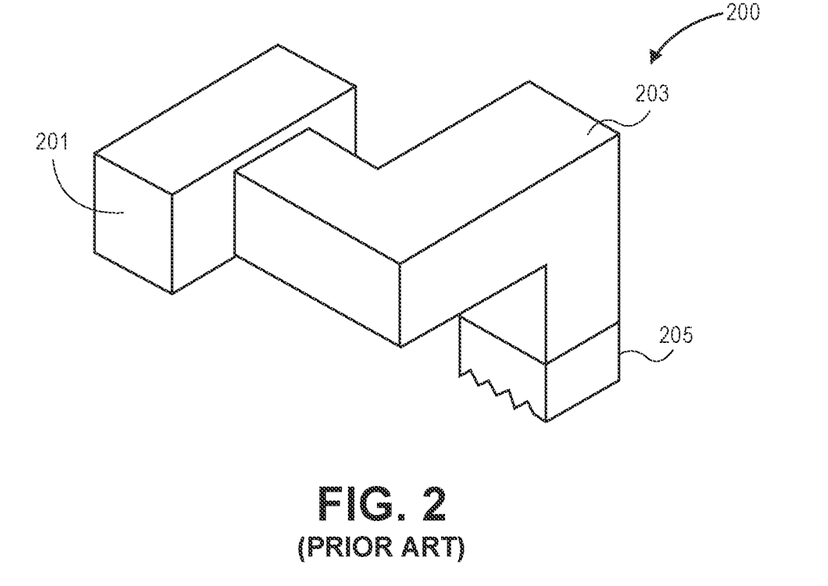
FIG. 2 is an illustration of an exemplary conventional optical refrigeration system with a sapphire heatlink.
Figure 3:
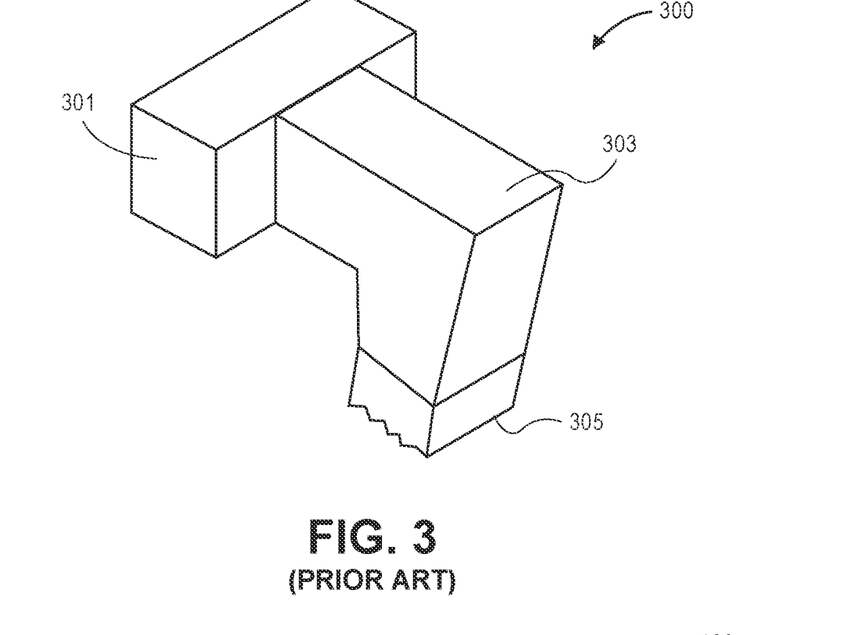
FIG. 3 is an illustration of an exemplary conventional optical refrigeration system with a YLF heatlink.

Different geometries of the heatlink have also been experimented to reduce the amount of fluorescence light that reaches the payload. FIG. 2 illustrates a typical optical refrigeration system 200 that includes a sapphire heatlink 203 to connect between the cooling crystal 201 and the payload 205. A known shape used on the sapphire heatlink 203 includes two sharp bends, which significantly reduces the amount of fluorescence light that reaches the payload 205. FIG. 3 illustrates a typical optical refrigeration system 300 that includes a bended YLF heatlink 303 that connects between the cooling crystal 301 and the payload 305. Although the bends reduces the light absorption by the payload, the complexity of the shapes increases the cost of manufacturing such a heatlink.

Therefore, it is desirable to design and fabricate an improved heatlink that has a high thermal conductivity (minimal thermal resistance), a high degree of fluorescence light rejection, a minimal optical absorption such as minimal heat producing losses (HPL), and be able to withstand frequent thermal cycling from room temperature to 100 K (−279.67° F. or −173.15° C.) or below.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

The present teachings relate to providing a heatlink for an optical refrigeration system, the optical refrigeration system comprises: a cooling crystal; a payload that is not directly connected to the cooling crystal; a heatlink that is connected to the cooling crystal and separately connected to the payload, comprising a single-crystalline magnesium fluoride (MgF$_2$) material; and a mirror placed at an interface between the heatlink and the payload.

The present teachings also relate to a method of cooling a payload with an optical refrigeration system comprising: sending a laser beam through a cooling crystal of an optical refrigeration system, the optical refrigeration system comprising a heatlink that is connected to the cooling crystal at a first interface surface located between the cooling crystal and the heatlink, a payload that is connected to a second interface surface of the heatlink, and a mirror placed at the interface surface between the heatlink and the payload;

creating fluorescent light through absorption of the laser beam in the cooling crystal; shielding the payload from the fluorescent light using the heatlink; reflecting any remaining light away from the payload using the mirror; and cooling the payload by removing energy from the cooling crystal and thermal conductively transporting heat from the payload to the cooling crystal.

In another embodiment, the cooling crystal comprises a yttrium lithium fluoride crystal. In another embodiment, the mirror comprises a metallic mirror, a dielectric mirror, or a semiconductor-based distributed Bragg reflector (DBR). In another embodiment, the heatlink is formed with at least one roughened surface that is unpolished. In another embodiment, the heatlink is formed with a shape comprising a bent shape, a rectangular slab shape, a square shape, an hour glass shape, a rectangular slab shape with tapered thickness, a trapezoidal slab shape with consistent thickness, and a combination thereof. In yet another embodiment, the heatlink is connected to the cooling crystal via adhesive-free bonding at the first interface surface between the heatlink and the cooling crystal.

Some advantages of the embodiments will be set forth in part in the description which follows, and in part will be understood from the description, or may be learned by practice of the invention. The advantages will be realized and attained by means of the elements and combinations particularly pointed out in the appended claims.

BRIEF DESCRIPTION OF THE DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DETAILED DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

Quality of the heatlink can be determined by calculating the heat-producing losses (HPL) of the heatlink. HPL is defined as the fraction of total fluorescence from the cooling crystal that is absorbed and converted to heat in the heatlink system. For example, assuming that the sapphire and YLF heatlinks are perfectly polished crystals with a metallic mirror coating on the "heatlink—payload" interface as provided conventionally, the optical refrigeration system 200 with sapphire has a HPL of 16.3%, and the optical refrigeration system 300 with YLF has a HPL of 0.9%.

The heatlinks according to the present teachings have a high thermal conductivity (minimal thermal resistance), a high degree of fluorescence light rejection, a minimal optical absorption such as minimal heat producing losses (HPL), and be able to withstand frequent thermal cycling from room temperature to 100 K (−279.67° F. or −173.15° C.) or below. The present teachings relate to heatlinks that are formed by textured crystals that are matched in coefficient of thermal expansion (CTE) to solid cooling elements, such as a yttrium lithium fluoride (YLF) cooling crystal, a lutetium lithium fluoride (LLF) cooling crystal, or any other crystalline hosts, and the heatlinks are shaped in geometries that result in very low heat-producing losses (HPL). The present teachings are described in four properties: 1) heatlink surface texture, 2) heatlink geometry, 3) heatlink material, and 4) mirror type.

Heatlink Surface Texture

The surface texture of the heatlink effects the reflectiveness of the fluorescence light at the material-air interface inside the heatlink. Light is commonly trapped inside the heatlink due to total internal reflection at the material-air interface that causes the light to be reflected back into the heatlink material. The reflected light is absorbed in the heatlink or cooling crystal, causing unwanted heating to occur.

The present teachings relate to extracting light from the heatlink by texturing or roughening at least one of the surfaces of the heatlink to reduce the rate of total internal reflection. By roughening or texturing the surfaces of the heatlink, the fluorescence light is scattered in various directions, which avoids total internal reflection that would be absorbed by the heatlink or the payload. At least one of the surfaces can be roughened purposely in desirable patterns, such as in diamond patterns, line patterns, geometric patterns, and others, or by random varietal patterns. The patterns or texturing can be provided via a mechanical technique (e.g., sandblasting) or a chemical technique (e.g., etching). The surfaces can also be roughened simply by not polishing the raw material surface after the material is cut and shaped. The heatlink may have textured, un-textured raw surfaces, and polished surfaces.

This roughening or texturing technique reduces the effective physical length needed for the heatlink because less length would be needed to reflect fluorescence light away from the payload. Consequently, the roughening technique reduces the economic cost of the manufacturing of heatlinks due to the fact that, since a roughened texture is desirable, it is sufficient to simply cut or ground the heatlink to a desired size and shape, and eliminates the polishing process in the finishing step of manufacturing the heatlink. Because a shorter length of heatlink is needed, it also reduces the material cost needed in manufacturing the heatlink. The roughening or texturing technique allows for a shorter link and may also improve thermal resistance between the heating crystal and the payload.

Heatlink Material

Although sapphire has low optical absorption and high thermal conductivity, sapphire's coefficient of thermal expansion (CTE) significantly mismatches the CTE of the YLF cooling crystal. This causes problems in bonding the material together at the interface of the two materials. Even if the materials are bonded, the differences in CTE causes stresses on the bond when temperature changes in the optical refrigeration system and often results in mechanical failure of the bond or the cooling crystal. Alternatively, it is possible to use an undoped YLF to form the heatlink, which does not have the problem of mismatch in CTE between the cooling crystal and the heatlink, however, the thermal conductivity of the YLF material is much lower than sapphire.

The present teachings relate to utilizing a heatlink material from a high-purity material that has a higher thermal conductivity than the YLF heatlink but has a CTE that is similar to YLF, for example, single-crystalline magnesium fluoride ($MgF_2$).

Magnesium fluoride ($MgF_2$) has a CTE that matches with the YLF cooling crystal, which reduces bonding issues at the interface. Both adhesive or, more preferably, adhesive-free bonding is available for bonding the interface of magnesium fluoride ($MgF_2$) and the YLF cooling crystal. The close match in CTE prevents mechanical failure due to stresses induced by temperature cycling of the optical refrigeration system, which is an inherent feature of the system.

Magnesium fluoride ($MgF_2$) also has a significantly higher thermal conductivity than a YLF heatlink, and magnesium fluoride ($MgF_2$) is also more readily available in higher quality with lower optical losses. As compared to the conventional sapphire heatlink, a magnesium fluoride ($MgF_2$) heatlink is lower in thermal conductivity, however, with a roughening technique applied, the magnesium fluoride ($MgF_2$) heatlink can be provided in shorter lengths for increased thermal contact, thus optical refrigeration system with a magnesium fluoride ($MgF_2$) heatlink would have a measured lower HPL than an optical refrigeration system with a sapphire heatlink.

Alternatively, other high purity material can be used as the heatlink material so long as the CTE is matched or is comparable to the cooling crystal material. In another embodiment, lutetium lithium fluoride (LLF) is used as the cooling crystal, a high purity single crystalline material that matches in (or has comparable) CTE can be used as a heatlink material.

Heatlink Geometry

Thermal conductance of the heatlink is calculated by $K = \kappa A/L$, where "K" is the coefficient of thermal conductivity as determined by the physical property of the material, "A" is the effective cross sectional area, and "L" is the length of the thermal link. It is desirable that the heatlink has a smallest possible effective length (L) to maximize the thermal conductance (K) of the heatlink. By using the described roughening/texturing technique that allows for a reduction in length, the effective length of the heatlink can be reduced. Similarly, having different geometric shapes in the formation of the heatlink can aid in the dispersion and reflection of fluorescent light away from the payload, thereby preventing the payload from absorbing the fluorescent light and convert it to heat.

The length (L) of the heatlink is optimized based on the desired cooling level and the material that is used as the heatlink. The heatlink length needs to be sufficiently long to reject fluorescence light to the desired level of HPL. The length (L) of the heatlink can be comparable to the length of the cooling crystal, be longer than the cooling crystal (which aids in light rejection), or be shorter than the cooling crystal (which aids in thermal conductance of heat through the heatlink from the payload towards the cooling crystal).

Example geometric shapes suitable for a heatlink of the present teachings are shown in FIGS. 4 to 9, with HPL calculated using magnesium fluoride ($MgF_2$) as the base material.

Figure 4:
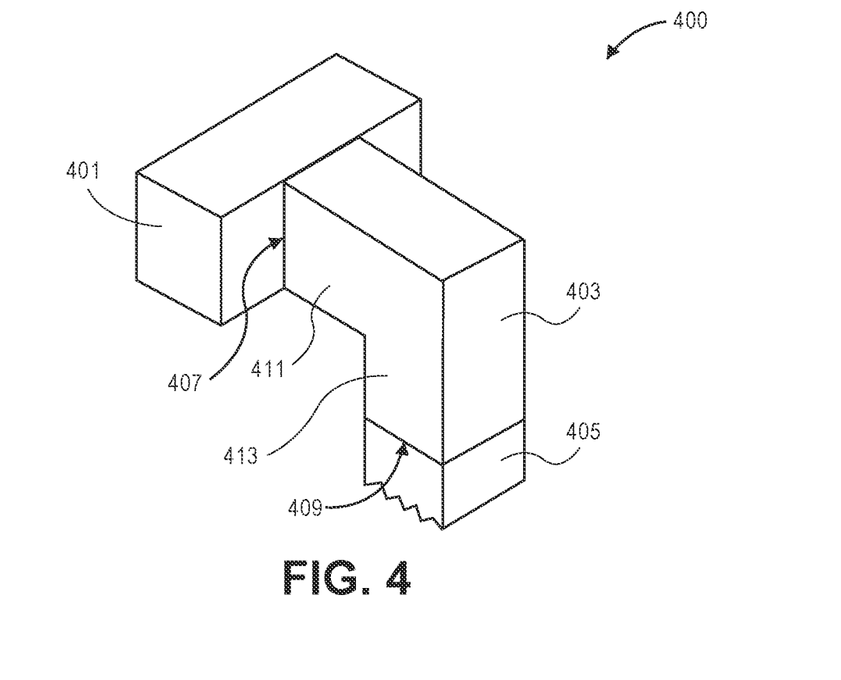
FIG. 4 is an illustration of a first embodiment heatlink having a 90 degrees angle.

FIG. 4 is an illustration of a first embodiment optical refrigeration system 400 according to the present teachings. The heatlink 403 has a 90 degree bend, which is connected to a cooling crystal 401 on a first end of a first arm the heatlink 403 and connected to a payload 405 at a second end of a second arm of the heatlink 403. The cooling crystal 401 and the payload 405 are connected on opposite arms in the 90 degree bend in the heatlink 403 to allow maximum deflection of light away from the payload 405. There may be a mirror placed at an interface 409 between the heatlink 403 and the payload 405. The HPL of optical refrigeration system 400 is 0.003%.

In another embodiment, a second arm 413 of the heatlink (after the bend) may have an equal length than a first arm 411 of the heatlink. In another embodiment, the second arm 413 of the heatlink may have a longer length than the first arm 411 of the heatlink. In another embodiment, the first arm 411 may have a longer length than the cross-sectional dimension of the cooling crystal.

In another embodiment, the bend in the heatlink may be in a range of between about 5 degrees to 175 degrees, or between about 45 degrees to about 135 degrees. In an embodiment, there may be an additional mirror placed at an interface 407 between the cooling crystal 401 and the heatlink 403.

Figure 5:
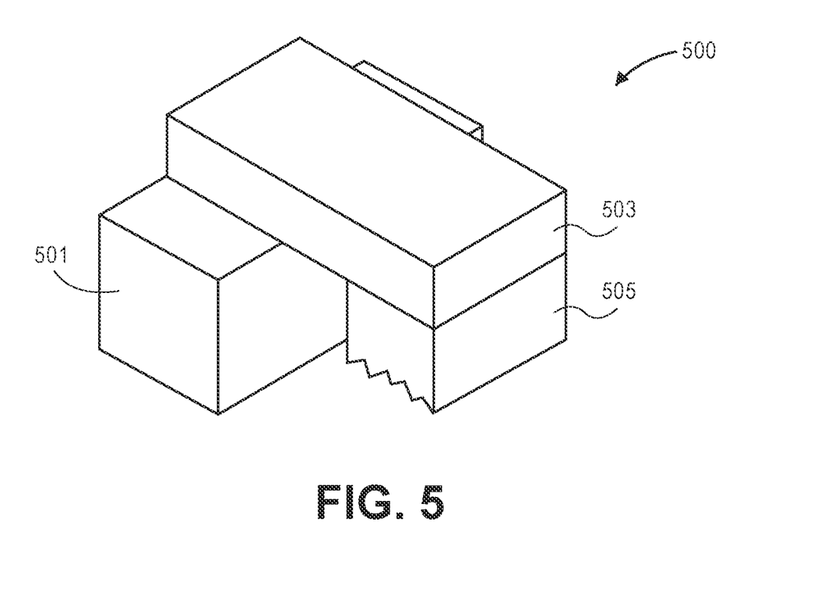
FIG. 5 is an illustration of a second embodiment heatlink having a slab geometry.

FIG. 5 is an illustration of a second embodiment optical refrigeration system 500 according to the present teachings. The heatlink 503 has a rectangular slab geometry that is connected to a cooling crystal 501 and a payload 505 on the same side surface of the rectangular slab shape, but the heatlink 503 is separately connected to the cooling crystal 501 and the payload 505 on opposite ends along the length of the same rectangular surface. There may be a mirror placed at the interface between the heatlink 503 and the payload 505. The HPL of optical refrigeration system 500 is 0.024%.

Along the surface of the heatlink, a distance between the cooling crystal-heatlink interface and the payload-heatlink interface can be optimized to include a baffle to block direct pass of fluorescence light from the cooling crystal to the payload. There may be a clam-shell that surrounds the cooling crystal and the heatlink that blocks fluorescence light from reaching the payload.

In another embodiment, there may be an additional mirror placed between the cooling crystal 501 and the heatlink 503.

Figure 6:
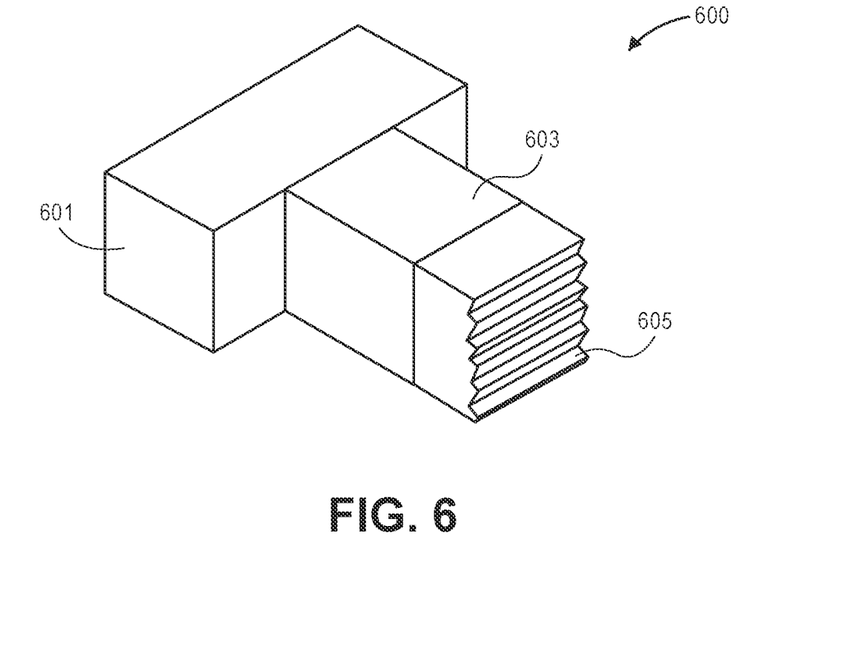
FIG. 6 is an illustration of a third embodiment heatlink having a rectangular geometry.

FIG. 6 is an illustration of a third embodiment optical refrigeration system 600 according to the present teachings. The heatlink 603 is in a rectangular shape without any bends, that connects to a cooling crystal 601 on one surface of the rectangular heatlink 603, and connects to a payload 605 on a surface that is directly opposite from the connected to the cooling crystal 601. With roughening of the surfaces and utilizing a high-purity material that has a high thermal conductivity but has a CTE that is similar to YLF, for example, single-crystalline magnesium fluoride ($MgF_2$), it is possible to utilize a short length heatlink that connects to the cooling crystal and the payload on directly opposite surfaces of a rectangularly shaped heatlink. There may be a mirror placed at the interface between the heatlink 603 and the payload 605. The HPL of optical refrigeration system 600 is 0.026%.

The dimensions for the rectangular shaped heatlink is optimized based on the desired condition of input laser power, cooling crystal size, and clamshell design. In another embodiment, there may be an additional mirror placed between the cooling crystal 601 and the heatlink 603.

Figure 7:
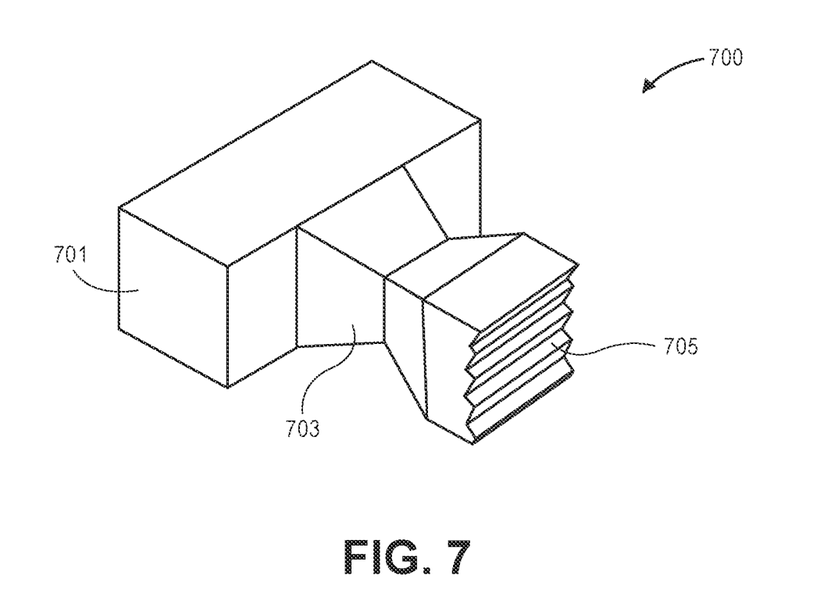
FIG. 7 is an illustration of a fourth embodiment heatlink having an hour glass shape geometry.

FIG. 7 is an illustration of a fourth embodiment optical refrigeration system 700 according to the present teachings. The heatlink 703 has an hour glass shape geometry that connects to the cooling crystal 701 on a top end of the hour glass shape and connects to a payload 705 on a bottom end of the hour glass shape. The heatlink 703 tapers from the top end and becomes narrower towards the middle section, and similarly, the bottom end tapers and becomes narrower towards the middle section of the heatlink 703. There may be a mirror placed at the interface between the heatlink 703 and the payload 705. The HPL of optical refrigeration system 700 is 0.0098%.

Using standard geometric optic analysis, dimensions can be optimized by minimizing the light leakage to the load while maintaining a short path to assure small enough thermal resistance. In an embodiment, there may be an additional mirror placed between the cooling crystal 701 and the heatlink 703.

Figure 8:
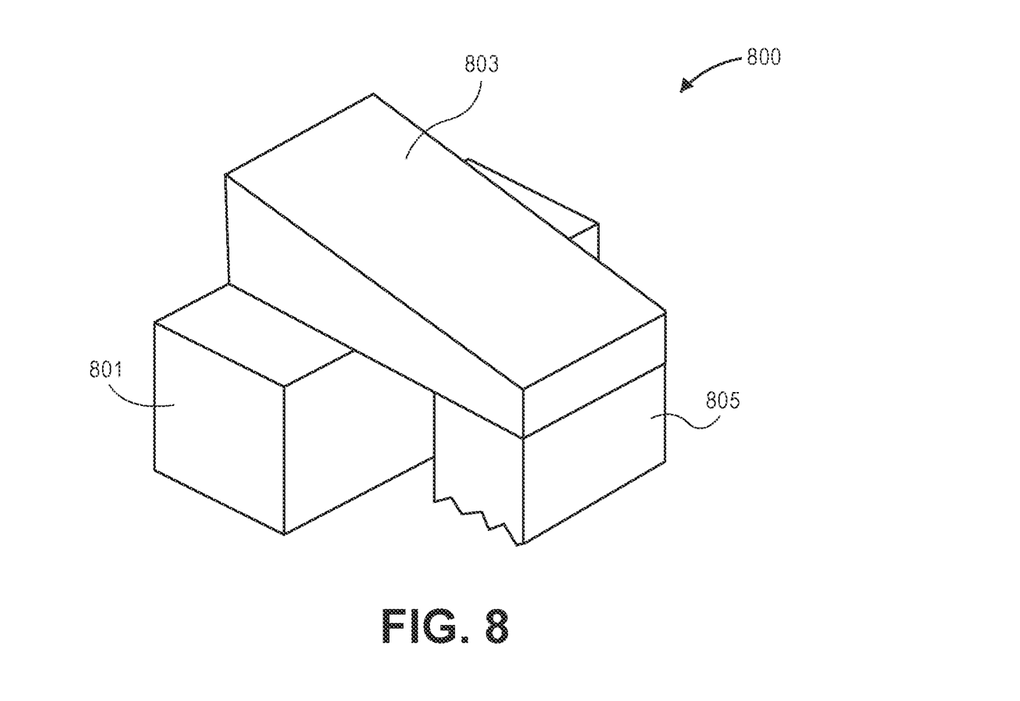
FIG. 8 is an illustration of a fifth embodiment heatlink having a slab geometry with tapered thickness.

FIG. 8 is an illustration of a fifth embodiment optical refrigeration system 800 according to the present teachings. The heatlink 803 has a rectangular slab shape that is tapered in thickness from one side of the heatlink 803 to an opposite side of the rectangular shape along the length of the heatlink 803. The heatlink 803 is connected to a cooling crystal 801 and a payload 805 on the same rectangular surface, but the heatlink 803 is separately connected to the cooling crystal 801 and the payload 805 on opposite ends along the length of the same rectangular surface. The heatlink 803 is shown to have a larger thickness at the end that is connected to the cooling crystal 801, and a smaller thickness at the end that is connected to the payload 805. Alternatively, the tapering of the heatlink thickness can be applied such that the thicker end is located at the connection to the payload and the thinner end is located at the connection to the cooling crystal. There may be a mirror placed at the interface between the heatlink 803 and the payload 805. The HPL of optical refrigeration system 800 is 0.009%.

Along the surface of the heatlink, a distance between the cooling crystal-heatlink interface and the payload-heatlink interface can be optimized to include a baffle to block direct pass of fluorescence light from the cooling crystal to the payload. There may be a clam-shell that surrounds the cooling crystal and the heatlink that blocks fluorescence light from the payload. In an embodiment, the tapering thickness can change, but the general shape of the slab will not change.

In an embodiment, there may be an additional mirror placed between the cooling crystal 801 and the heatlink 803.

Figure 9:
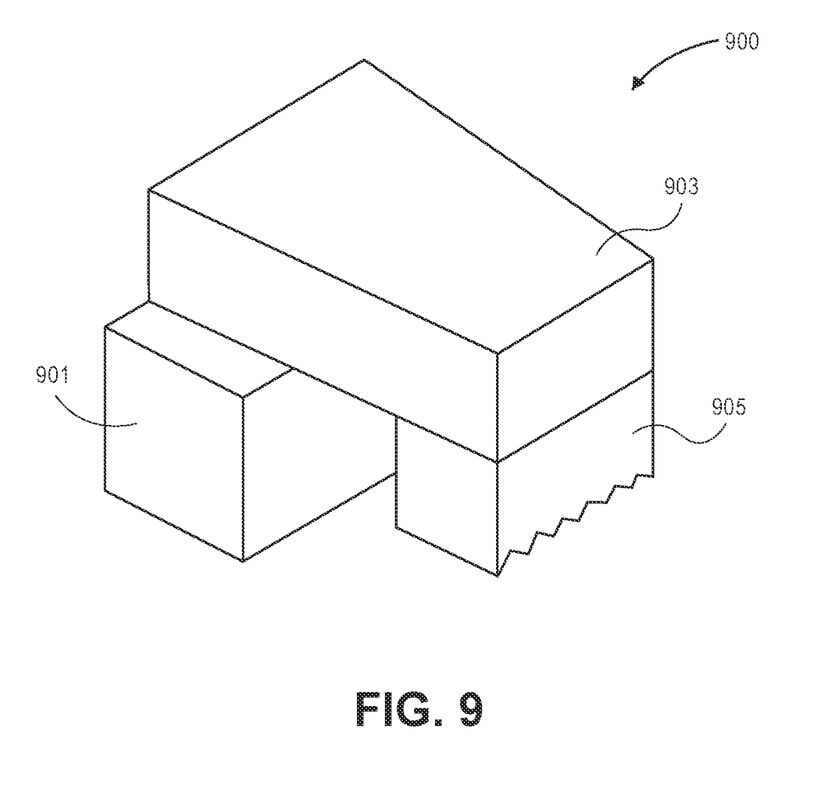
FIG. 9 is an illustration of a sixth embodiment heatlink having a slab geometry with tapered widths.

FIG. 9 is an illustration of a sixth embodiment optical refrigeration system 900 according to the present teachings. The heatlink 903 has a trapezoidal slab shape with a constant thickness. The heatlink 903 is connected to a cooling crystal 901 and a payload 905 on the same trapezoid surface, but the heatlink 903 is separately connected to the cooling crystal 901 and the payload 905 on opposite ends along the length of the same trapezoid surface. The heatlink 903 is shown to have a larger width along the end that connects to the cooling crystal 901, and tapers to a smaller width along the end that connects to the payload 905. Alternatively, the tapering of the heatlink's width can be applied such that the larger width is located at the connection to the payload, and the smaller width is located at the connection to the cooling crystal. There may be a mirror placed at the interface between the heatlink 903 and the payload 905. The HPL of optical refrigeration system 900 is 0.001%.

Along the surface of the heatlink, a distance between the cooling crystal-heatlink interface and the payload-heatlink interface can be optimized to include a baffle to block direct pass of fluorescence light from the cooling crystal to the payload. There may be a clam-shell that surrounds the cooling crystal and the heatlink that blocks fluorescence light from the payload. In an embodiment, the tapering thickness can change, but the general shape of the slab will not change In an embodiment, there may be an additional mirror placed between the cooling crystal 901 and the heatlink 903.

Compared to the conventional optical refrigeration systems using sapphire heatlinks and YLF heatlinks, having a HPL of 16.3% and a HPL of 0.9%, respectfully, the optical refrigeration systems using heatlinks of the present teachings, such as shown in FIGS. 4 to 9, have much lower HPL.

Mirror Type

Mirrors, such as dielectric or metallic, are typically placed at the interface between the heatlink and the payload to reduce the fluorescence light that reaches the payload and gets converted to heat. However, dielectric mirrors have low thermal conductivity. A metallic mirror (such as silver or gold) has high thermal conductivity but has low reflectivity (at between around 95% to around 98%), thus causing too much absorption if exposed to a significant amount of light.

The present teaching relates to utilizing a mirror that has a high thermal conductivity and can be placed in direct contact with the cooling crystal, such as a semiconductor-based distributed Bragg reflector (DBR). A DBR is a multilayer mirror that uses epitaxial semiconductor materials for the different layers, therefore achieves a higher thermal conductivity than a dielectric mirror. Semiconductor material also have higher refractive index (such as GaAs and AlAs material) compared to typical dielectric mirror materials. A DBR mirror would allow a thinner mirror to be used with better thermal conductivity and the reflectivity is higher over a larger range of incident angles. Semiconductor DBRs are also compatible with adhesion-free bonding with various crystal materials, such as sapphire, YLF, and magnesium fluoride ($MgF_2$), therefore it is a desirable mirror material that can be used to reduce mechanical failure due to stress induced at the interface between the heatlink and the payload from temperature cycling of the optical refrigeration system. Because most payloads are comprised of metal, and connects to a heatlink with a metal end, using a DBR mirror at the interface between the heatlink and the payload would reflect a lot of the fluorescence light from the heatlink, thus prevent absorption of the light by the metal payload material.

In another embodiment, the mirror can be placed at the interface surface between the heatlink and the cooling crystal. In another embodiment, the mirror can be placed at both the interface surface between the heatlink and the cooling crystal, and the interface surface between the heatlink and the payload.

In an optical refrigeration system of the present teachings, the optical refrigeration system comprises a cooling crystal that is connected to a heatlink at a first interface surface located between the cooling crystal and the heatlink, a payload that is connected to a second interface surface of the heatlink, and a mirror placed at the interface surface between the heatlink and the payload, the interface surface between the heatlink and the cooling crystal, or both interfaces. The laser beam is absorbed in the cooling crystal, creating fluorescent light. The heatlink then prevents most of the light from reaching the heatlink-payload interface, and what little light does reach the interface is reflected using a mirror. The payload is cooled by: sending a laser beam through a cooling crystal of an optical refrigeration system; creating fluorescent light through absorption of the laser beam in the cooling crystal; shielding the payload from the fluorescent light using the heatlink; reflecting any remaining light away from the payload using the mirror; and cooling the payload by removing energy from the cooling crystal and thermal conductively transporting heat from the payload to the cooling crystal.

By utilizing heatlinks that are formed by textured crystals that are matched in coefficient of thermal expansion (CTE) to the yttrium lithium fluoride (YLF) cooling crystal, and shaped in geometries that result in very low heat-producing losses (HPL), the heatlinks according to the present teachings have a high thermal conductivity (minimal thermal resistance), a high degree of fluorescence light rejection, a minimal optical absorption such as minimal heat producing losses (HPL), and be able to withstand frequent thermal cycling. The heatlink of the present teachings act as an efficient thermal conductor to transfer heat from the payload towards the cooling crystal, and an efficient shield to reflect any remaining fluorescent light away from the payload to prevent conversion from light to heat.

The heatlinks of the present teachings are also economically more favorable than conventional heatlinks due to the ability to reduce at least a manufacturing step of polishing the heatlink product, and the ability of reducing the amount of material needed to form the heatlinks because the efficient length of the heatlink can be shortened.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

What is claimed is:

1. An optical refrigeration system comprising:
   a cooling crystal;
   a payload that is not directly connected to the cooling crystal;
   a textured heatlink that is connected to the cooling crystal and separately connected to the payload, comprising a single-crystalline magnesium fluoride ($MgF_2$) material; and
   a mirror placed at an interface between the textured heatlink and the payload.

2. The optical refrigeration system of claim 1, wherein the cooling crystal comprises a yttrium lithium fluoride crystal or a lutetium lithium fluoride crystal.

3. The optical refrigeration system of claim 1, wherein the mirror comprises a metallic mirror, a dielectric mirror, or a semiconductor-based distributed Bragg reflector (DBR).

4. The optical refrigeration system of claim 1, wherein the textured heatlink is formed with at least one roughened surface that is unpolished.

5. The optical refrigeration system of claim 4, wherein the roughened surface is formed with a mechanical or chemical technique.

6. The optical refrigeration system of claim 1, wherein the textured heatlink is formed with a shape comprising a bent shape, a rectangular slab shape, a square shape, an hour glass shape, a rectangular slab shape with tapered thickness, a trapezoidal slab shape, or a combination thereof.

7. The optical refrigeration system of claim 6, wherein the bent shape has a bend in an angle between 5 degrees to 175 degrees.

8. The optical refrigeration system of claim 7, wherein the second arm has a length that is equal to or longer than the first arm, and the first arm has a length that is longer than a cross-sectional dimension of the cooling crystal.

9. The optical refrigeration system of claim 6, wherein the textured heatlink having a bent shape includes a first arm that connects to the cooling crystal and a second arm that connects to the payload.

10. The optical refrigeration system of claim 1, wherein the textured heatlink is connected to the cooling crystal via adhesive-free bonding at the interface of the textured heatlink and the cooling crystal.

11. A method of cooling a payload with an optical refrigeration system comprising:
sending a laser beam through a cooling crystal in the optical refrigeration system, the optical refrigeration system further comprising a textured heatlink that is connected to the cooling crystal at a first interface surface located between the cooling crystal and the textured heatlink, the payload connected to a second interface surface of the textured heatlink, and a mirror placed at the second interface surface between the textured heatlink and the payload;
creating fluorescent light through absorption of the laser beam in the cooling crystal;
shielding the payload from the fluorescent light using the textured heatlink;
reflecting any remaining light away from the payload using the mirror; and
cooling the payload by removing energy from the cooling crystal and thermal conductively transporting heat from the payload to the cooling crystal; and
wherein the textured heatlink comprises a single-crystalline magnesium fluoride ($MgF_2$) material.

12. The method of claim 11, wherein the cooling crystal comprises a yttrium lithium fluoride crystal or a lutetium lithium fluoride crystal.

13. The method of claim 11, wherein the mirror comprises a metallic mirror, a dielectric mirror, or a semiconductor-based distributed Bragg reflector (DBR).

14. The method of claim 11, wherein the textured heatlink is formed with at least one roughened surface that is unpolished.

15. The method of claim 14, wherein the roughened surface is formed with a mechanical or chemical technique.

16. The method of claim 11, wherein the textured heatlink is formed with a shape comprising a bent shape, a rectangular slab shape, a square shape, an hour glass shape, a rectangular slab shape with tapered thickness, a trapezoidal slab shape, or a combination thereof.

17. The optical refrigeration system method of claim 16, wherein the bent shape has a bend in an angle between about 5 degrees to 175 degrees.

18. The method of claim 11, wherein the textured heatlink is connected to the cooling crystal via adhesive-free bonding at the first interface surface between the textured heatlink and the cooling crystal.

* * * * *

UNITED STATES PATENT AND TRADEMARK OFFICE
CERTIFICATE OF CORRECTION

| | | |
|---|---|---|
| PATENT NO. | : 11,088,506 B1 | Page 1 of 1 |
| APPLICATION NO. | : 16/260680 | |
| DATED | : August 10, 2021 | |
| INVENTOR(S) | : Mansoor Sheik-Bahae et al. | |

It is certified that error appears in the above-identified patent and that said Letters Patent is hereby corrected as shown below:

In the Claims

In Claim 17, Column 12, Line 24, "The optical refrigeration system method of claim 16," should read --The method of claim 16,--.

Signed and Sealed this
Seventh Day of September, 2021

Drew Hirshfeld
*Performing the Functions and Duties of the*
*Under Secretary of Commerce for Intellectual Property and*
*Director of the United States Patent and Trademark Office*